United States Patent
Nagase et al.

(10) Patent No.: US 7,804,534 B2
(45) Date of Patent: Sep. 28, 2010

(54) SOLID-STATE IMAGING DEVICE, DRIVING METHOD THEREOF, AND IMAGING APPARATUS

(75) Inventors: Masanori Nagase, Miyagi (JP); Shu Takahashi, Miyagi (JP); Jiro Matsuda, Miyagi (JP); Mitsuru Iwata, Saitama (JP); Shinji Uya, Miyagi (JP)

(73) Assignee: FUJIFILM Corporation, Tokyo (JP)

( * ) Notice: Subject to any disclaimer, the term of this patent is extended or adjusted under 35 U.S.C. 154(b) by 723 days.

(21) Appl. No.: 11/705,766

(22) Filed: Feb. 14, 2007

(65) Prior Publication Data
US 2008/0055449 A1    Mar. 6, 2008

(30) Foreign Application Priority Data
Feb. 17, 2006 (JP) .............................. 2006-040966

(51) Int. Cl.
*H04N 9/64* (2006.01)
*H01L 31/062* (2006.01)
*H01L 31/113* (2006.01)

(52) U.S. Cl. ................... 348/249; 348/250; 257/294

(58) Field of Classification Search ................ 348/241, 348/243, 248–250, 304, 307, 311, 312, 324; 257/291–2, 294; 250/208.1
See application file for complete search history.

(56) References Cited

U.S. PATENT DOCUMENTS

| | | | |
|---|---|---|---|
| 5,736,756 A | * | 4/1998 | Wakayama et al. ......... 257/223 |
| 7,473,977 B2 | * | 1/2009 | Kitano et al. ............... 257/435 |
| 2007/0278535 A1 | * | 12/2007 | Watanabe et al. ........... 257/233 |

FOREIGN PATENT DOCUMENTS

| JP | 7-153932 A | 6/1995 |
|---|---|---|
| WO | WO 2004079825 A1 * | 9/2004 |

* cited by examiner

*Primary Examiner*—Sinh Tran
*Assistant Examiner*—Daniel M Pasiewicz
(74) *Attorney, Agent, or Firm*—Birch, Stewart, Kolasch & Birch, LLP (57) ABSTRACT

A solid-state imaging device comprises: a semiconductor substrate; a plurality of photoelectric conversion elements formed in a surface portion of the semiconductor substrate in the form of a two-dimensional array so as to comprise a plurality of sets, each comprising a subset of the photoelectric conversion elements arranged in one direction; charge transfer paths each formed at a side portion of the subset of the photoelectric conversion elements to cause a signal charge of the photoelectric conversion elements be read out when a readout pulse is applied and cause the signal charge which has been read out to be transferred when a transfer pulse is applied; and an electrically conductive light shielding film which is laminated on a surface of the semiconductor substrate through an insulating layer and has openings immediately above each of the photoelectric conversion elements.

2 Claims, 8 Drawing Sheets

SOLID-STATE IMAGING DEVICE, DRIVING METHOD THEREOF, AND IMAGING APPARATUS

BACKGROUND OF THE INVENTION

1. Field of the Invention

The present invention relates to a solid-state imaging device and a driving method thereof, and more particularly to a solid-state imaging device suitable for such as smear reduction and the lowering of a readout voltage as well as a driving method thereof and an imaging apparatus.

2. Description of the Related Art

On a semiconductor substrate of a solid-state imaging device, a multiplicity of n-type region portions are formed in a p-well layer of a surface portion by being arranged in the form of a two-dimensional array to form a multiplicity of photodiodes (pn junction portions: photoelectric conversion elements). A metallic light shielding film provided with an opening above each photodiode is laminated on the surface of the solid-state imaging device. In the related-art solid-state imaging device, a predetermined potential is adapted to be applied to this light shielding film.

For example, in the related-art technique disclosed in JP-A-7-153932, a high-concentration impurity layer of an opposite conductivity type (p type) is formed on the surface of the above-described n-type region portion, and a contact hole is provided in an insulating layer laminated on the surface of the semiconductor substrate, so that the light shielding film and the high-concentration impurity layer are electrically connected through the contact hole. As a predetermined potential is applied to the light shielding film, the surface potential of the photodiode is set to the quasi-Fermi level or less of the high-concentration impurity layer.

Alternatively, as a potential lower than the surface potential of the photodiode is applied to the light shielding film, minority carriers (holes) generated by photoelectric conversion are allowed to escape to the light shielding film so as to reduce the recombination of signal charges (electrons) and the minority carriers.

With the related-art solid-state imaging devices, attempts have been made to reduce smear and the like by applying a predetermined potential to the light shielding film and by directly controlling the potential of the high-concentration impurity layer to a predetermined potential through the contact hole. However, in solid-state imaging devices in which millions of pixels or more are mounted as in the devices of recent years, the size of each single pixel (photodiode) is extremely small, so that it has become difficult to form a contact hole in each single pixel. In addition, the effect of metal contamination due to direct contact of the light shielding film with the semiconductor substrate through the contact hole has become such that it cannot be neglected. Accordingly, there has been a demand for improving the performance of the solid-state imaging device such as the reduction of smear through other methods.

SUMMARY OF THE INVENTION

An object of the invention is to provide a solid-state imaging device which makes it possible to attain improvement of device performance such as the reduction of smear and the lowering of a readout voltage as well as a driving method thereof and an imaging apparatus.

According to the invention, there is provided a solid-state imaging device comprising: a semiconductor substrate; a plurality of photoelectric conversion elements formed in a surface portion of the semiconductor substrate in the form of a two-dimensional array so as to comprise a plurality of sets, each comprising a subset of the photoelectric conversion elements arranged in one direction; charge transfer paths each formed at a side portion of the subset of the photoelectric conversion elements to cause a signal charge of the photoelectric conversion elements be read out when a readout pulse is applied and cause the signal charge which has been read out to be transferred when a transfer pulse is applied; and an electrically conductive light shielding film which is laminated on a surface of the semiconductor substrate through an insulating layer and has openings immediately above each of the photoelectric conversion elements, a potential of a same polarity as that of the readout pulse being applied to the light shielding film when the readout pulse is applied to a readout electrode of the charge transfer paths, and a potential of an opposite polarity to that of the readout pulse being applied to the light shielding film when the readout pulse is not applied to the readout electrode.

In the solid-state imaging device according to the invention, the solid-state imaging device further comprises an impurity surface layer provided in a surface portion of each of the photoelectric conversion elements, and the impurity surface layer comprises a high-concentration region portion of a central portion and a low-concentration region portion of a peripheral portion, and an end of each of the openings of the light shielding film extends up to a position so that the light shielding film covers the low-concentration region portion.

In the solid-state imaging device according to the invention, the potential of the same polarity is applied to the light shielding film by preceding the readout pulse for a predetermined time period, and the potential of the opposite polarity is applied to the light shielding film by lagging behind the termination of the readout pulse for a predetermined time period.

According to the invention, there is provided a method of driving a solid-state imaging device, the device comprising: a semiconductor substrate; a plurality of photoelectric conversion elements formed in a surface portion of the semiconductor substrate in the form of a two-dimensional array so as to comprise a plurality of sets, each comprising a subset of the photoelectric conversion elements arranged in one direction; charge transfer paths each formed at a side portion of the subset of the photoelectric conversion elements to cause a signal charge of the photoelectric conversion elements be read out when a readout pulse is applied and cause the signal charge which has been read out to be transferred when a transfer pulse is applied; and an electrically conductive light shielding film which is laminated on a surface of the semiconductor substrate through an insulating layer and has openings immediately above each of the photoelectric conversion elements, the method comprising applying a potential of a same polarity as that of the readout pulse to the light shielding film when the readout pulse is applied to a readout electrode of the charge transfer paths; and applying a potential of an opposite polarity to that of the readout pulse to the light shielding film when the readout pulse is not applied to the readout electrode.

In the method of driving a solid-state imaging device according to the invention, the potential of the same polarity is applied to the light shielding film by preceding the readout pulse for a predetermined time period, and the potential of the opposite polarity is applied to the light shielding film by lagging behind the termination of the readout pulse for a predetermined time period.

In the method of driving a solid-state imaging device according to the invention, the potential of the same polarity is applied to the light shielding film as a square or trapezoidal potential waveform.

According to the invention, there is provided an imaging apparatus comprising: a semiconductor substrate; a plurality of photoelectric conversion elements formed in a surface portion of the semiconductor substrate in the form of a two-dimensional array so as to comprise a plurality of sets, each comprising a subset of the photoelectric conversion elements arranged in one direction; charge transfer paths each formed at a side portion of the subset of the photoelectric conversion elements to cause a signal charge of the photoelectric conversion elements be read out when a readout pulse is applied and cause the signal charge which has been read out to be transferred when a transfer pulse is applied; an electrically conductive light shielding film which is laminated on a surface of the semiconductor substrate through an insulating layer and has openings immediately above each of the photoelectric conversion elements; and an imaging device driving section that applies a potential of a same polarity as that of the readout pulse to the light shielding film when the readout pulse is applied to a readout electrode of the charge transfer paths, and applies a potential of an opposite polarity to that of the readout pulse to the light shielding film when the readout pulse is not applied to the readout electrode.

In the imaging apparatus according to the invention, the imaging apparatus further comprises an impurity surface layer provided in a surface portion of each of the photoelectric conversion elements, and the impurity surface layer comprises a high-concentration region portion of a central portion and a low-concentration region portion of a peripheral portion, and an end of each of the openings of the light shielding film extends up to a position so that the light shielding film covers the low-concentration region portion.

The imaging device driving section of the imaging apparatus in accordance with the invention applies the potential of the same polarity to the light shielding film by preceding the readout pulse for a predetermined time period, and applies the potential of the opposite polarity to the light shielding film by lagging behind the termination of the readout pulse for a predetermined time period.

The imaging device driving section of the imaging apparatus in accordance with the invention applies the potential of the same polarity to the light shielding film as a square or trapezoidal potential waveform.

DETAILED DESCRIPTION OF THE INVENTION

Hereafter, a description will be given of an embodiment of the invention with reference to the accompanying drawings.

Figure 1:
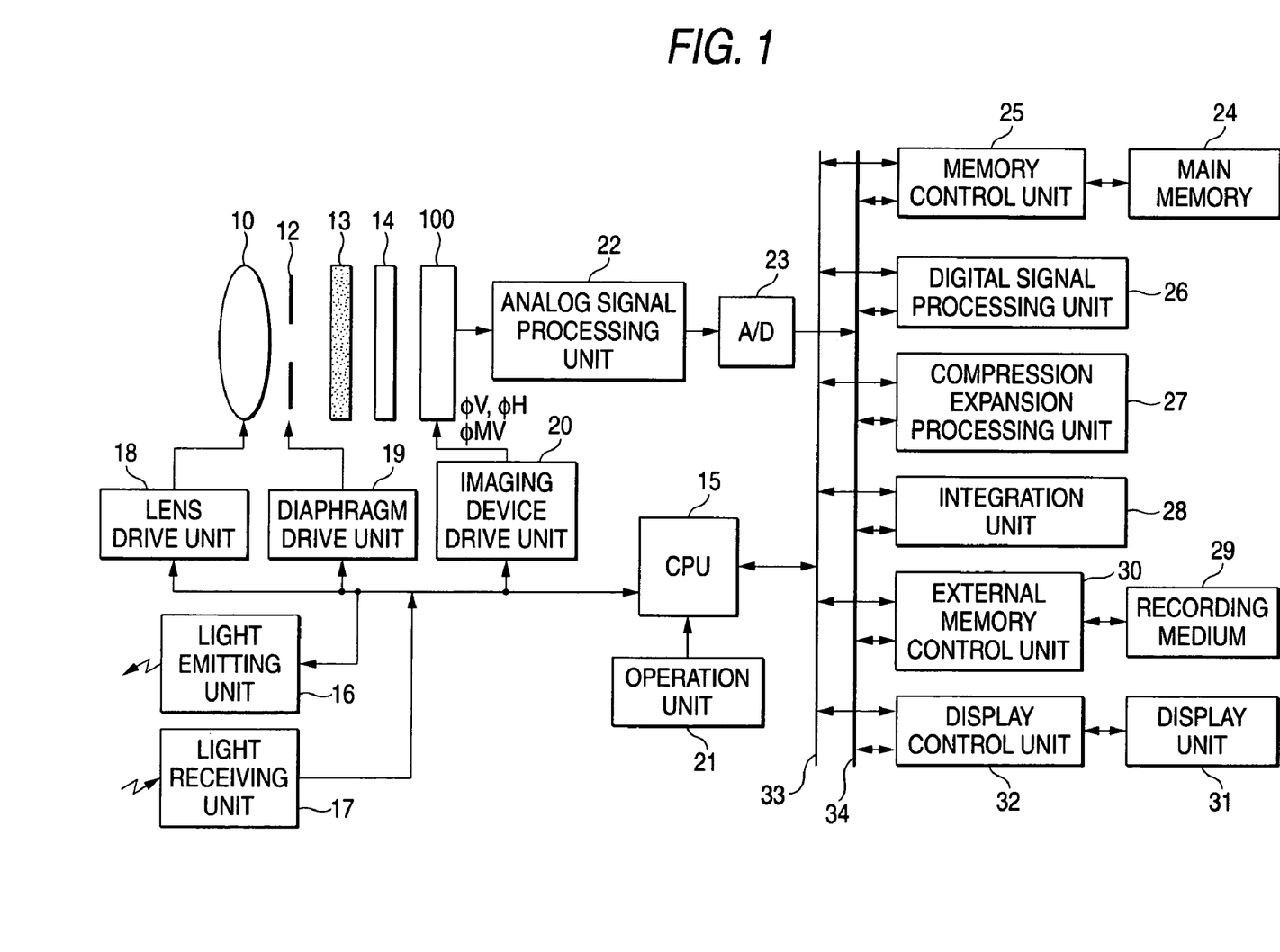
FIG. 1 is a functional block diagram of a digital camera in accordance with an embodiment of the invention.

FIG. 1 is a functional block diagram of a digital camera in which a solid-state imaging device in accordance with the embodiment of the invention is mounted. The illustrated digital camera is comprised of a taking lens 10, a CCD type solid-state imaging device 100, a diaphragm 12 provided between these members, an infrared cutoff filter 13, and an optical low-pass filter 14. A CPU 15 which performs supervisory control of the overall digital camera controls a flashlight emitting unit 16 and a light receiving unit 17, adjusts the position of the taking lens 10 to a focus position by controlling a lens drive unit 18, and effects adjustment of exposure amount by controlling the amount of opening of the diaphragm 12 through a diaphragm drive unit 19.

In addition, the CPU 15 drives the solid-state imaging device 100 through an imaging device drive unit 20 to cause the solid-state imaging device 100 to output a subject image captured through the taking lens 10 as chrominance signals. An instruction signal from a user is inputted to the CPU 15 through an operation unit 21, and the CPU 15 performs various control in accordance with this instruction.

An electric control system of the digital camera includes an analog signal processing unit 22 connected to an output of the solid-state imaging device 100, as well as an A/D conversion circuit 23 for converting R, G, and B chrominance signals outputted from this analog signal processing unit 22. The analog signal processing unit 22 and the A/D conversion circuit 23 are controlled by the CPU 15.

The electric control system of this digital camera further includes a memory control unit 25 connected to a main memory (frame memory) 24; a digital signal processing unit 26 for performing an interpolation operation, a gamma correction operation, RGB/YC conversion processing, and the like; a compression/expansion processing unit 27 for compressing the captured image into a JPEG image or expanding the compressed image; an integration unit 28 for integrating photometric data to determine a gain for white balance correction which is effected by the digital signal processing unit 26; an external memory control unit 30 to which a detachable recording medium 29 is connected; and a display control unit 32 to which a liquid crystal display unit 31 mounted on the rear surface or the like of the camera is connected. These units are connected to each other through a control bus 33 and a data bus 34, and are controlled by commands from the CPU 15.

Figure 2:
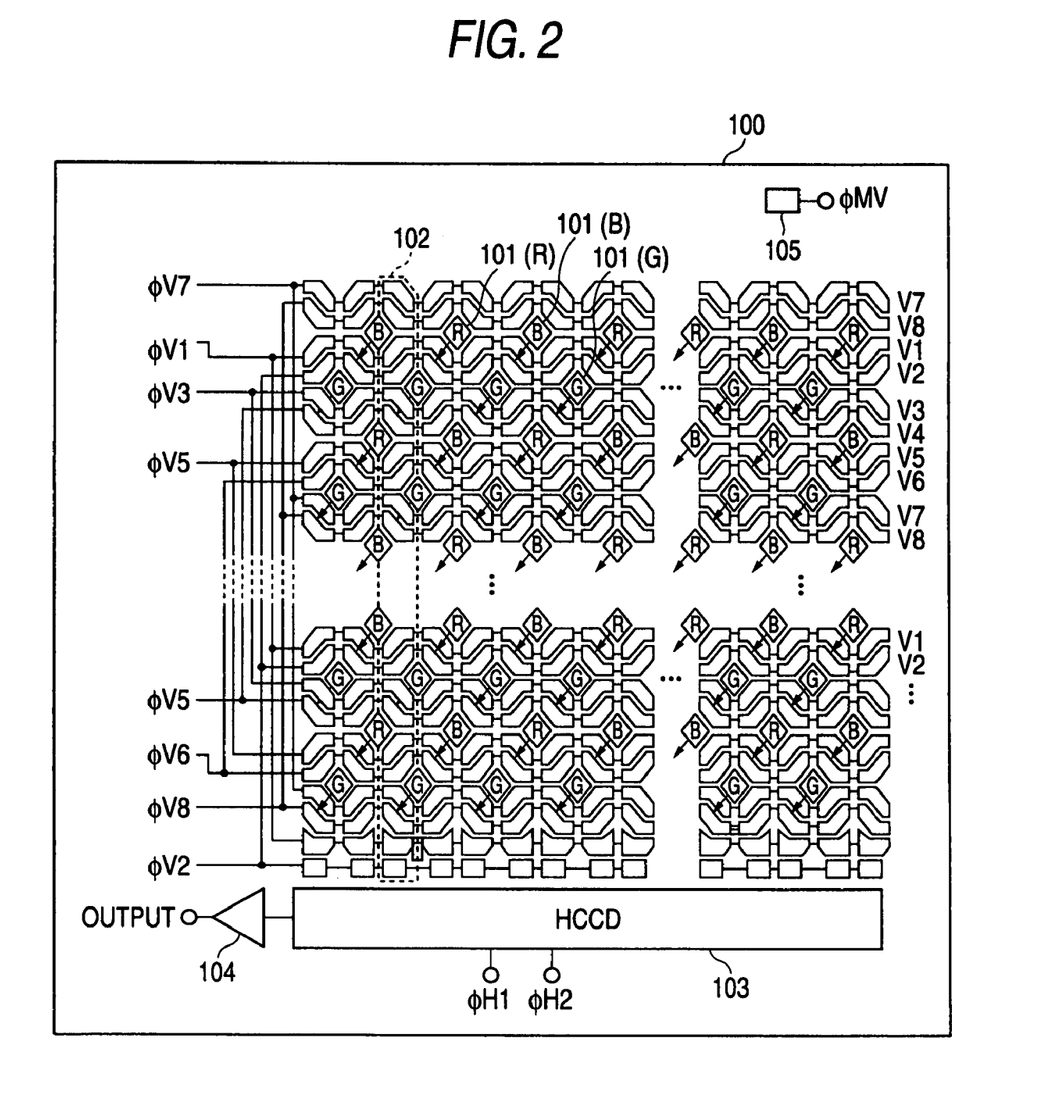
FIG. 2 is a schematic plan view of a solid-state imaging device shown in FIG. 1.

FIG. 2 is a schematic plan view of the solid-state imaging device 100 shown in FIG. 1. The illustrated solid-state imaging device 100 has a multiplicity of photodiodes (photoelectric conversion elements) 101 formed on a semiconductor substrate by being arranged in the form of a two-dimensional array, such that the photodiodes 101 in even-numbered rows are disposed in such a manner as to be respectively offset with respect to the photodiodes 101 in odd-numbered lines by a half pitch (in a so-called honeycomb pixel arrangement).

The characters "R," "G," and "B" illustrated on the respective photodiodes 101 represent the colors (red being R, green being G, and blue being B) of color filters laminated on the respective photodiodes, and each photodiode 101 accumulates signal charges corresponding the quantity of the received light of one of the three primary colors. It should be noted that although an example in which primary color-based color filters are installed is illustrated, complementary color-based color filters may alternatively be installed.

Vertical transfer electrodes V1, V2, . . . , and V8 are laid in the horizontal direction on the surface of the semiconductor substrate in a meandering manner so as to avoid the respective photodiodes 101. An unillustrated embedded channel is formed on the semiconductor substrate alongside each photodiode column arranged in the vertical direction in such a manner as to meander in the vertical direction so as to avoid the photodiodes 101.

A vertical transfer path (VCCD) 102 is formed by this embedded channel and the vertical transfer electrodes provided thereon and disposed in such a manner as to meander in the vertical direction. This vertical transfer path 102 is driven for transfer by vertical transfer pulses $\phi$V1 to $\phi$V8 (the illustrated example is that of 8-phase drive) which are outputted from the imaging device drive unit 20 shown in FIG. 1.

A horizontal transfer path (HCCD) 103 is provided on a lower side portion of the semiconductor substrate. This horizontal transfer path 103 is also constituted by an embedded channel and horizontal transfer electrodes provided thereon. This horizontal transfer path 103 is two-phase driven by horizontal transfer pulses $\phi$H1 and $\phi$H2 which are outputted from the imaging device drive unit 20 shown in FIG. 1.

An output amplifier 104 is provided at an output end portion of the horizontal transfer path 103. The output amplifier 104 outputs as an image signal a voltage value signal corresponding to the quantity of signal charges transferred to the end portion of the horizontal transfer path 103.

It should be noted that although the terms "vertical" and "horizontal" have been used, the terms mean "one direction" along the surface of the semiconductor substrate and "a direction substantially perpendicular to this one direction."

On the substantially entire surface of the solid-state imaging device 10 shown in FIG. 2, a metallic light shielding film provided with an opening is laminated immediately above each photodiode 101. Further, a pad 105 for applying a required control pulse voltage $\phi$MV to the light shielding film is provided at a predetermined portion of the surface of the semiconductor substrate. The control pulse voltage $\phi$MV is applied from the imaging device drive unit 20 shown in FIG. 1 to the light shielding film through the pad 105.

Figure 3:
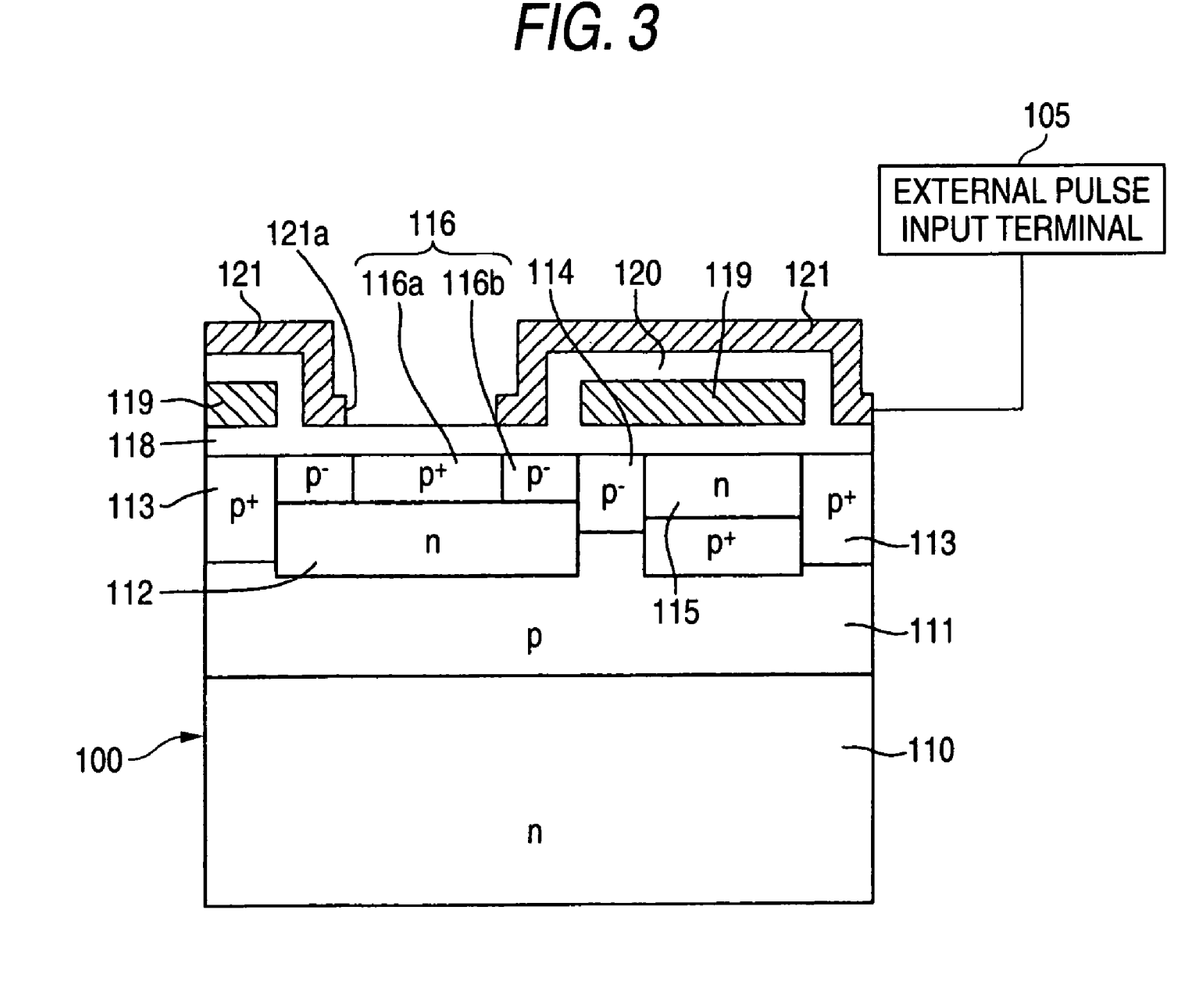
FIG. 3 is a schematic cross-sectional view of a substantially one pixel portion of the solid-state imaging device shown in FIG. 2.

FIG. 3 is a schematic cross-sectional view of a substantially one pixel portion of the solid-state imaging device shown in FIG. 2. A p-well layer 111 is formed in an n-type semiconductor substrate 110 of this solid-state imaging device 100, and an n-type region portion 112 is provided on a surface portion of the p-well layer 111, thereby forming the photodiode 101 for effecting photoelectric conversion with respect to the p-well layer 111 (hereafter the n-type region portion 112 will be also referred to as the photodiode).

An element isolating region (p$^+$ region) 113 is provided is provided on an adjacent pixel side of the n-type region portion (photodiode) 112, and an n region 115 is provided on the opposite side to the photodiode 112 via a readout gate portion (p$^-$ region) 114. This n region 115 constitutes the embedded channel of the vertical transfer path 102 described with reference to FIG. 2.

A high-concentration impurity surface layer 116 of an opposite conductivity type (p type) is provided on a surface portion of the n-type region portion 112. As this high-concentration impurity surface layer 116 is provided, free electrons generated as a dark current are captured by holes in the high-concentration impurity surface layer 116, thereby preventing dark current components from appearing as white streaks in an image.

The high-concentration impurity surface layer 116 is provided by being divided into a central high-concentration portion (p$^+$ region) 116a on the surface of the n-type region portion 112 and a low-concentration portion (p$^-$ region) 116b in its surrounding portion. As the surrounding portion is formed as the low-concentration portion 116b, the electric field in the surrounding portion is weakened, which makes it possible to lower the voltage at the time of reading out the accumulated charges in the photodiode (n-type region portion) 112 to the embedded channel 115 of the vertical transfer path.

The outermost surface of the semiconductor substrate 110 in which the photodiodes 112, the embedded channels 115, and the like have been formed is covered with a transparent insulating layer 118 of an ONO (oxide film/nitride film/oxide film) structure or a single-layered structure of an oxide film. A vertical transfer electrode film (e.g., a polysilicon film) 119 is laminated on the insulating layer 118 immediately above the embedded channel 115.

A metallic light shielding film 121 is laminated over the vertical transfer electrode film 119 via an insulating layer 120. An opening 121a is provided in the light shielding film 121 immediately above each photodiode 112, and incident light passes through this opening 121a and is made incident into the n-type region portion 112.

In addition, in the solid-state imaging device 100 in accordance with this embodiment, an end of the light shielding film opening 121a extends up to a position covering the low-concentration portion 116b of the high-concentration impurity surface layer 116. The pad (an input terminal with an external pulse $\phi$MV) 105 shown in FIG. 2 is connected to this light shielding film 121.

An unillustrated transparent flattening layer is laminated on the light shielding film 121, an unillustrated color filter layer is laminated on the surface of the flattening layer whose surface has been formed flat, and a microlens is laminated thereon.

When an image is photographed with the digital camera having the above-described configuration, the incident light from a subject field which entered through the taking lens 10 is applied to a light receiving surface of the solid-state imaging device 100. When the light is incident upon the photodiodes 112, signal charges (electrons in this example) corresponding to the respective quantities of incident light are accumulated in the photodiodes 112.

When the CPU 15 outputs a command to the imaging device drive unit 20, and the imaging device drive unit 20 outputs a readout pulse to the solid-state imaging device 100, this readout pulse is applied to the vertical transfer electrode 119 which also serves as a readout electrode. As a result, the accumulated charges (signal charges) in each photodiode 112 are read out to the embedded channel 115 through the readout gate portion 114.

When the CPU 15 outputs the command to the imaging device drive unit 20, and the imaging device drive unit 20 outputs a vertical transfer pulse $\phi$V and a horizontal transfer pulse $\phi$H to the solid-state imaging device 100, the respective signal charges on the vertical transfer path 102 are transferred on the vertical transfer path for one transfer electrode at a time. When the signal charges corresponding to one line portion of the photodiodes have been transferred to the horizontal transfer path 103, this one line portion of signal charges is transferred on the horizontal transfer path 103, and a voltage value signal corresponding to the quantity of signal charges is read out by the amplifier 104.

In such a readout operation of the signal charges, in the digital camera in accordance with this embodiment, the CPU 15 outputs a command to the imaging device drive unit 20, and performs control of a pulse voltage φMV to be applied to the light shielding film. Hereafter, a description will be given of applied voltage control of the light shielding film.

Figures 4A, 4B:
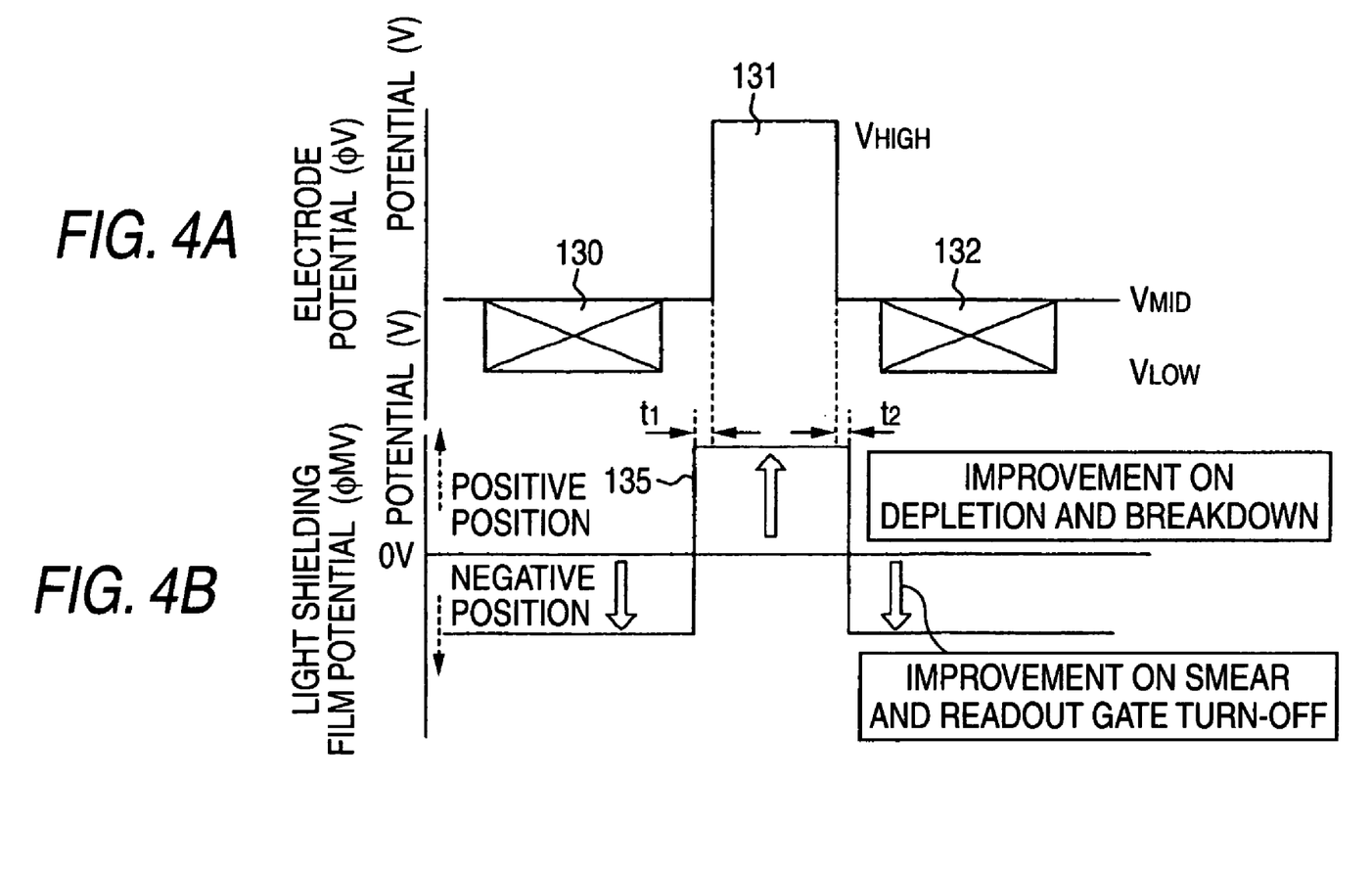
FIGS. 4A and 4B are waveform diagrams explaining a method of driving a solid-state imaging device in accordance with the embodiment of the invention.

FIG. 4A is a diagram illustrating a pulse waveform which is applied to the vertical transfer electrode (also serving as a readout electrode), and FIG. 4B is a diagram illustrating a pulse waveform which is applied to the light shielding film.

Before the signal charges are read out from the photodiode to the vertical transfer path, the vertical transfer path is driven by a high-speed sweep pulse (e.g., Vmid=0 V, Vlow=−8 V) 130. Consequently, unwanted charges on the vertical transfer path are swept away from the vertical transfer path.

Next, when a readout pulse (e.g., Vhigh=15 V) 131 is applied to the vertical transfer electrode also serving as the readout electrode, the accumulated charges in the photodiode are read out to the vertical transfer path. Then, as the vertical transfer path is driven by a transfer pulse 132, the transfer of the signal charges in the direction of the horizontal transfer path is effected.

At this time, as shown in FIG. 4B, the CPU 15 applies a pulse voltage (φMV) 135 to the light shielding film 121 through the pad 105. This pulse voltage 135 is such a pulse voltage that it is synchronized with the readout pulse 131. A high-level potential is controlled to the potential of the same polarity as the readout pulse 131, i.e., to a predetermined positive potential in this example, whereas a low-level potential is controlled to the potential of the opposite polarity to that of the readout pulse 131, i.e., to a predetermined negative potential in this example.

The light shielding film 121 is always controlled to a predetermined negative potential except when the signal charges are read out from the photodiode to the vertical transfer path. Further, in this embodiment, when the readout pulse is applied to the vertical transfer electrode also serving as the readout electrode, a predetermined positive potential is applied to the light shielding film 121 by preceding the readout pulse 131 for a predetermined time period t1. When the readout pulse 131 terminated, the light shielding film 121 is returned to the predetermined negative potential by lagging behind this point of time of termination for a predetermined time period t2. The setting provided may be such that t1=t2, or t1≠t2.

It should be noted that although in FIG. 4B the pulse waveform of the pulse voltage 135 applied to the light shielding film is set to be a square wave, but may be a trapezoidal wave.

Figure 5:
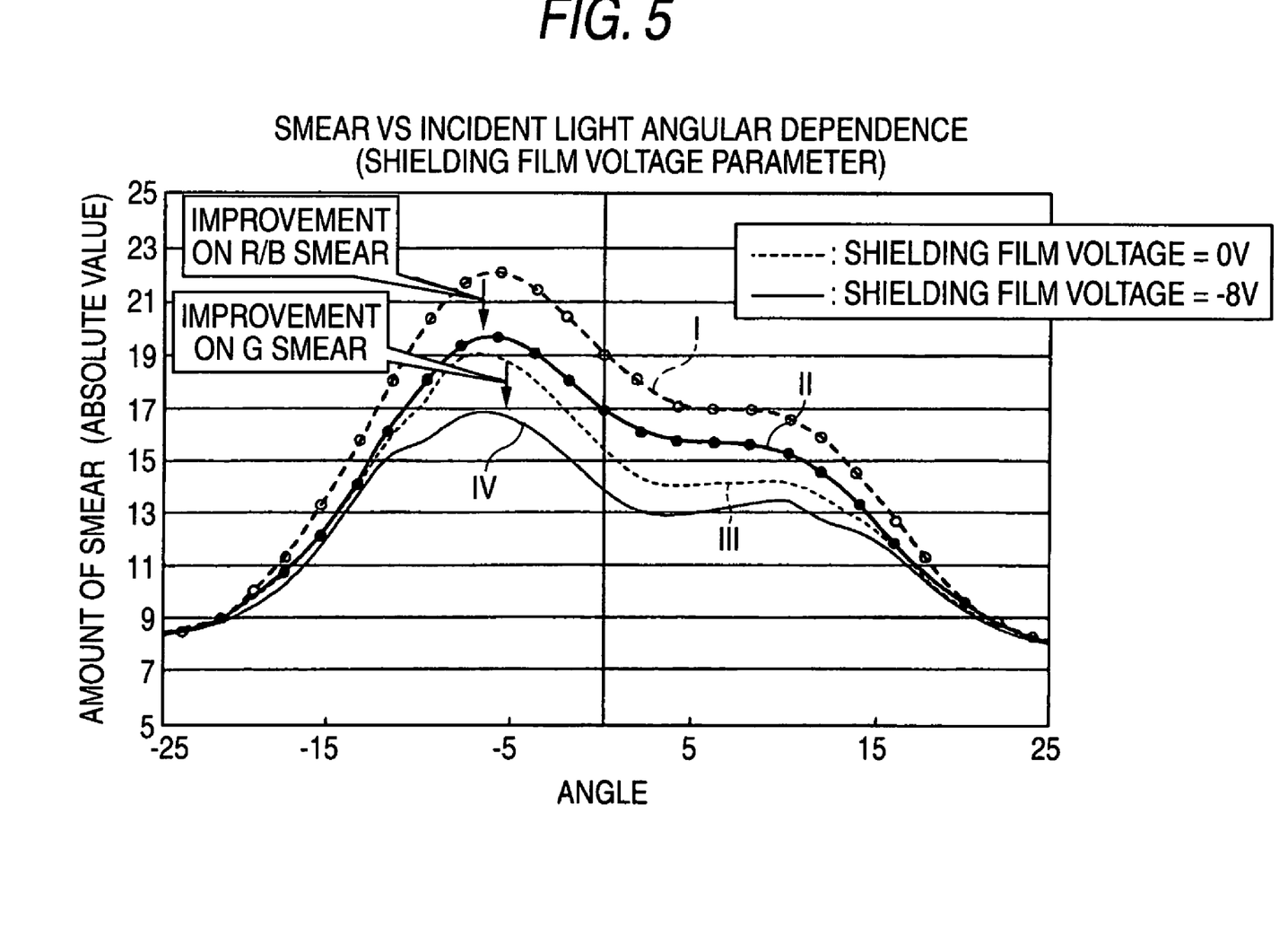
FIG. 5 is a graph illustrating the relationship between the smear and incident light angular dependence when the voltage to be applied to a light shielding film is varied in the solid-state imaging device in accordance with the embodiment of the invention.

FIG. 5 is a graph on actually measured data illustrating the improvement of smear characteristics in the solid-state imaging device 100 in accordance with this embodiment. In a case where the applied voltage of the light shielding film is always fixed to "0 V," the absolute amount of smear with respect to the incident angle of the incident light is shown by curves I and II in the graph. The characteristic curve I shows the smear characteristic included in the signal charge of red (R) or blue (B), and the characteristic curve II shows the smear characteristic included in the signal charge of green (G).

In contrast, it can be appreciated that if the voltage to be applied to the light shielding film is controlled to a predetermined negative potential (e.g., −8 V) as in the solid-state imaging device 100 of this embodiment, in comparison with the characteristic curves I and II the smear characteristics can be improved by 20% or thereabouts as in the case of the characteristic curves III (smear characteristic of R or B) and IV (smear characteristic of G) shown in FIG. 5.

This is conceivably attributable to the fact that electrons which enter the embedded channel 115 through the insulating layer 118 between the end of the opening 121a of the light shielding film and the semiconductor substrate 110 can be prevented by applying a negative potential to the light shielding film 121. It can be expected that the smear improvement rate can be improved by further increasing the negative potential to be applied to the light shielding film 121.

Figure 6:
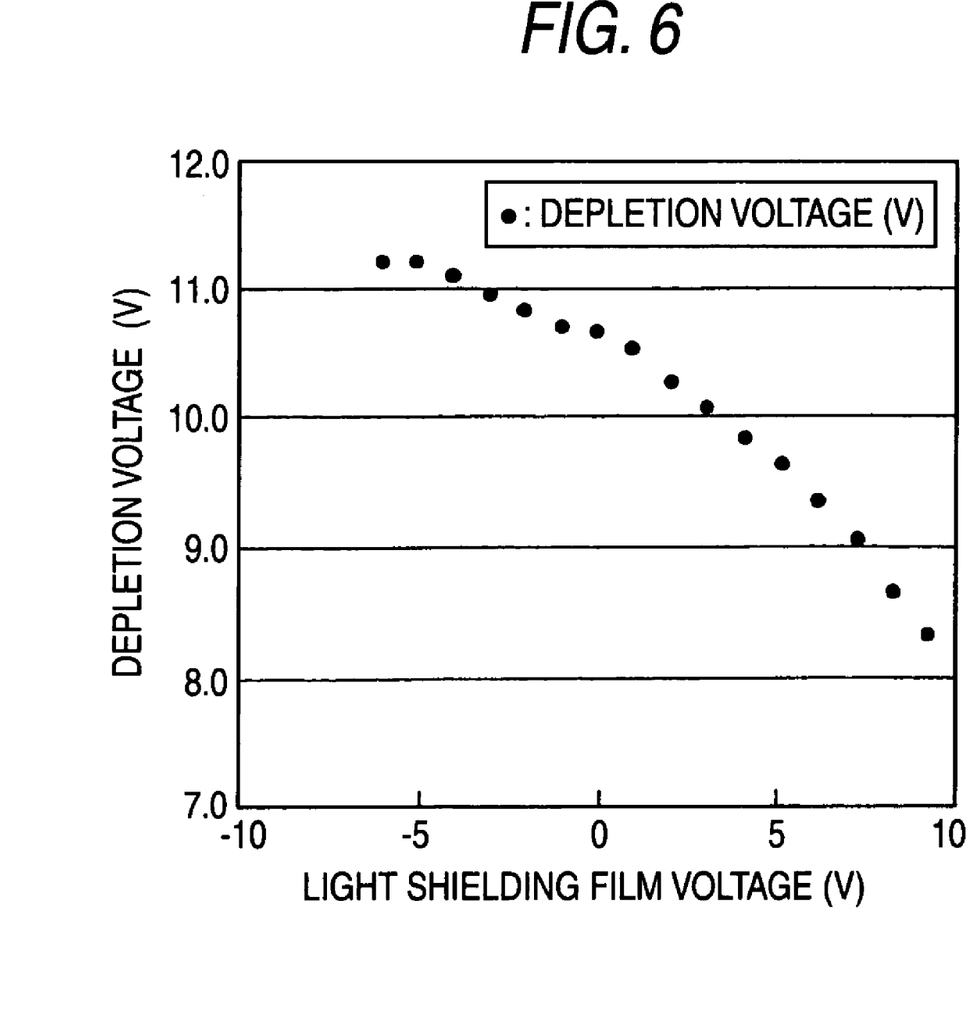
FIG. 6 is a graph illustrating the relationship between a depletion voltage and the applied voltage of the light shielding film in the solid-state imaging device in accordance with the embodiment of the invention.

FIG. 6 is a graph on actually measured data illustrating changes in a depletion voltage with respect to the applied voltage of the light shielding film. From the arrangement of the data on measurement points in FIG. 6, it can be seen that the higher the applied voltage of the light shielding film is set on the high voltage side, the more the depletion is improved. From the data, it can be seen that when the depletion voltage is to be set to 10 V or less, it suffices if the voltage to be applied to the light shielding film is set to +3 V or higher.

In this embodiment, when the signal charges are read out from the photodiode to the vertical transfer path, a predetermined positive potential is applied to the light shielding film 121. On the basis of the data in FIG. 6, the depletion voltage can be set to 10 V or less by setting the predetermined positive potential to "+3 V" or higher, and the movement of signal charges (electrons) from the photodiode to the vertical transfer path can be facilitated. Namely, the movement of electrons can be assisted.

At this time, in this embodiment, since the light shielding film 121 is provided at the position covering the low-concentration portion 116b of the high-concentration impurity surface layer 116, as shown in FIG. 3, the light shielding film 121 performs the function of a gate electrode, allowing the signal charges of the n-type region portion 112 to move to the embedded channel 115 more easily.

Figure 7:
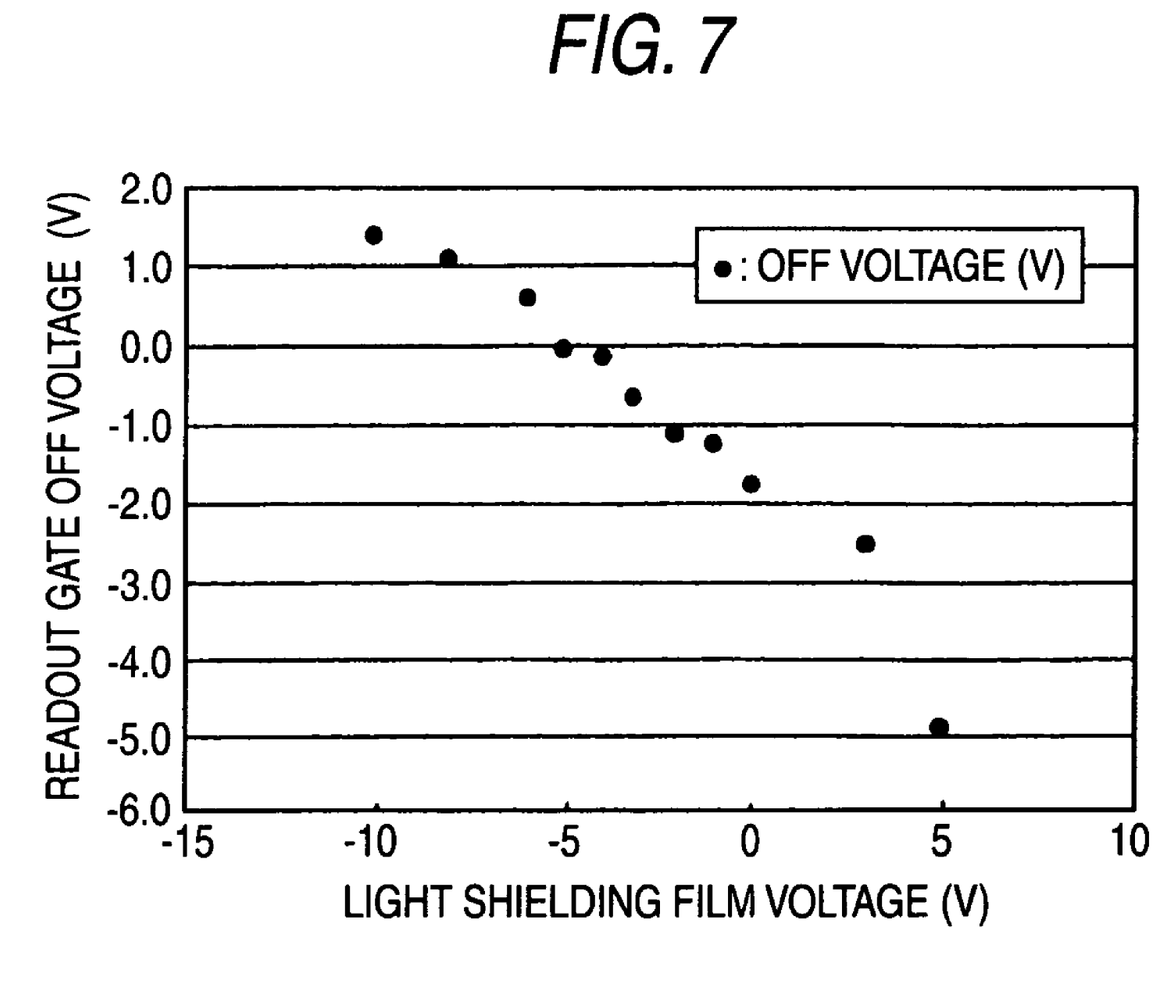
FIG. 7 is a graph illustrating the relationship between the readout gate turn-off voltage and the applied voltage of the light shielding film in the solid-state imaging device in accordance with the embodiment of the invention.

FIG. 7 is a graph on actually measured data illustrating changes in a readout gate turn-off voltage with respect to the applied voltage of the light shielding film. In the solid-state imaging device 100 in accordance with this embodiment, the voltage to be applied to the light shielding film is controlled to a predetermined negative voltage at all timings except for the timing for reading out the signal charges from the photodiode to the vertical transfer path. In consequence, the potential of the readout gate portion 114 becomes low except at the time of reading out the signal charges, so that the off voltage can be set higher.

According to FIG. 7, it can be understood that in a case where the off voltage is to be set to 0 V or higher, it suffices if the voltage to be applied to the light shielding film is set to −5 V or less. Namely, by applying a negative voltage to the light shielding film 121 except at the time of reading out the signal charges, it is possible to prevent a situation in which signal charges (electrons) undesirably move from the photodiode 112 to the vertical transfer path 115 at a timing which is irrelevant to the reading out of the signal charges. It can be expected that the off voltage characteristic improves further by further lowering the voltage to be applied to the light shielding film.

Figure 8:
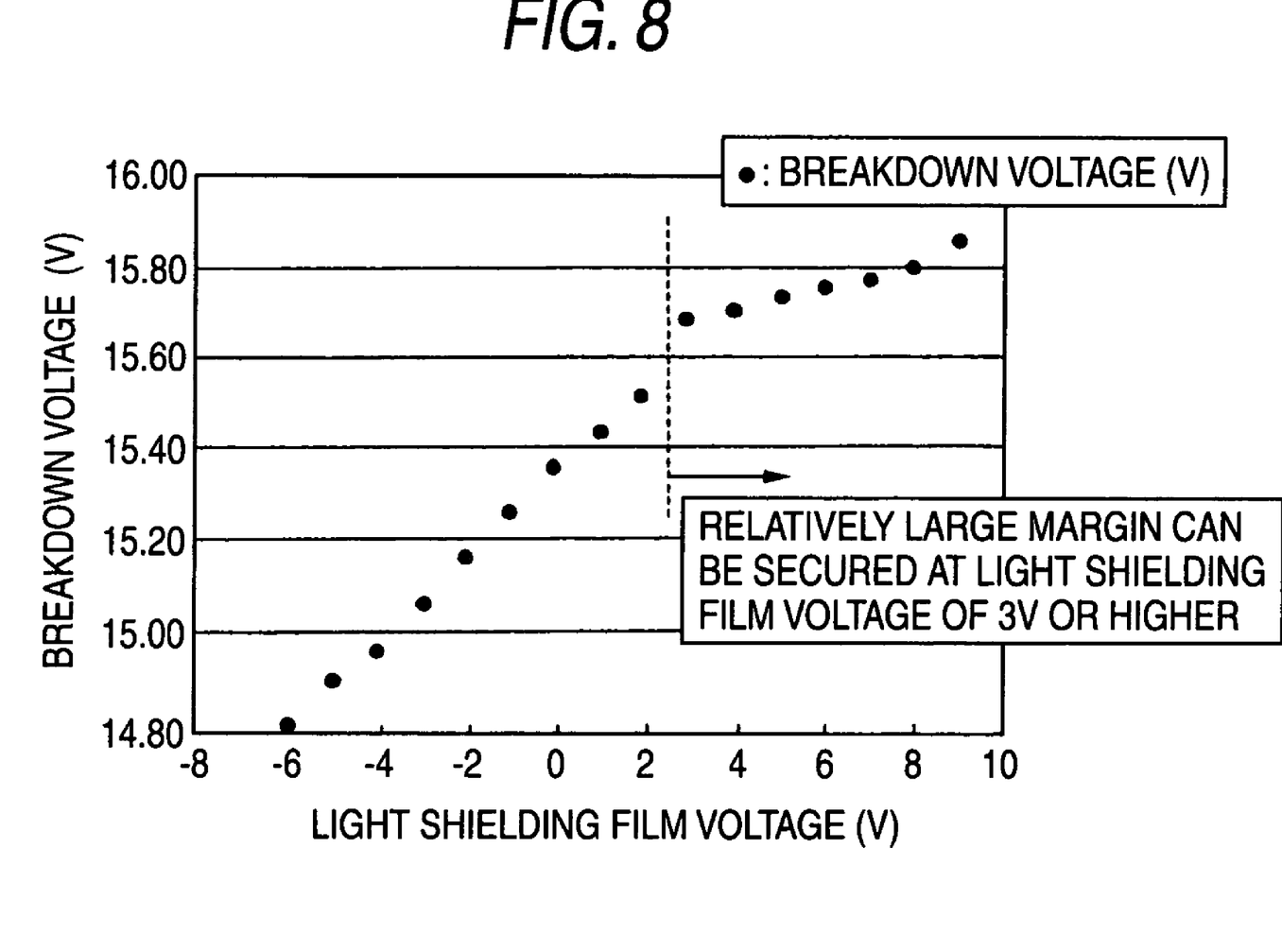
FIG. 8 is a graph illustrating the relationship between the breakdown voltage and the applied voltage of the light shielding film in the solid-state imaging device in accordance with the embodiment of the invention.

FIG. 8 is a graph on actually measured data illustrating changes in a breakdown voltage with respect to the applied voltage of the light shielding film. As described above, the smear can be reduced if a negative voltage is always applied to the light shielding film 121, as described above. However, if the potential at the light shielding film kept at the negative potential at the time of reading out the signal charges, a potential difference between the light shielding film 121 and the readout electrode (to which, for example, +15 V is applied) becomes undesirably large. Hence, there is a breakdown at the element isolating region (p$^+$ region) 113 provided between the pixel and an adjacent pixel is feared.

The data shown in FIG. 8 indicates that the lower the applied voltage of the light shielding film, the lower the breakdown voltage which causes a breakdown, and the more the breakdown is likely to occur.

Therefore, in the solid-state imaging device 100 in accordance with this embodiment, the voltage to be applied to the light shielding film is controlled to a predetermined positive voltage by preceding the turning on of the readout pulse 131 for the predetermined time period t1 until lagging behind the turning off of the readout pulse 131 for the predetermined time period t2.

As a result, it is possible to make small the potential difference between the light shielding film and the adjacent pixel electrode at the time of reading out of the signal charges, thereby making it possible to avoid the occurrence of a breakdown. According to the data in FIG. 8, the characteristic curve of the voltage at which the breakdown occurs changes greatly with a voltage of "+3 V" applied to the light shielding film as a boundary. Therefore, the occurrence of the breakdown can be effectively suppressed by setting the applied voltage of the light shielding film to at least "+3 V" or higher. In addition, it is also possible to increase the margin for breakdown by setting the positive voltage to be applied to the light shielding film 121 to an even higher level.

As described above, according to this embodiment, the pulse voltage to be applied to the light shielding film is applied in tune with the readout pulse, and the high-level potential and the low-level potential of this pulse voltage are adjusted as described above. Therefore, advantages can be obtained in that it is possible to improve the smear characteristics of the imaging device, improve the breakdown voltage, improve the depletion voltage, and improve the readout gate turn-off voltage.

According to the invention, the voltage applied to the light shielding film is set as a pulse voltage synchronized with the readout pulse, and the high-level potential is set to a potential of the same polarity as that of the readout pulse, while the low-level potential is set to a potential of an opposite polarity to that of the readout pulse. Therefore, advantages can be obtained in that the smear characteristics improve, that the breakdown voltage improves, that the depletion voltage improves, that low readout-voltage drive is made possible, and that the readout gate turn-off voltage improves.

The solid-state imaging device in accordance with the invention offers an advantage of improved device performance, and is useful as a solid-state imaging device for mounted in a digital camera or the like and as a driving method thereof.

The entire disclosure of each and every foreign patent application from which the benefit of foreign priority has been claimed in the present application is incorporated herein by reference, as if fully set forth.

What is claimed is:

1. A method of driving a solid-state imaging device, the device comprising:

a semiconductor substrate;

a plurality of photoelectric conversion elements formed in a surface portion of the semiconductor substrate in the form of a two-dimensional array so as to comprise a plurality of sets, each comprising a subset of the photoelectric conversion elements arranged in one direction; charge transfer paths each formed at a side portion of the subset of the photoelectric conversion elements to cause a signal charge of the photoelectric conversion elements be read out when a readout pulse is applied and cause the signal charge which has been read out to be transferred when a transfer pulse is applied; and an electrically conductive light shielding film which is laminated on a surface of the semiconductor substrate through an insulating layer and has openings immediately above each of the photoelectric conversion elements, the method comprising applying a pulse voltage having a potential of a same polarity as that of the readout pulse to the light shielding film when the readout pulse is applied to a readout electrode of the charge transfer paths; and applying the pulse voltage having a potential of an opposite polarity to that of the readout pulse to the light shielding film when the readout pulse is not applied to the readout electrode, wherein:

the pulse voltage having the potential of the same polarity applied to the light shielding film occurs during the readout pulse and precedes the readout pulse by a predetermined time period, and the pulse voltage having the potential of the opposite polarity is applied to the light shielding film after the readout pulse having the voltage of the same polarity terminates and lags behind the termination of the readout pulse by a predetermined time period.

2. The method of driving a solid-state imaging device according to claim 1, wherein the potential of the same polarity is applied to the light shielding film as a square or trapezoidal potential waveform.

* * * * *